(12) United States Patent
Dip et al.

(10) Patent No.: US 8,263,474 B2
(45) Date of Patent: Sep. 11, 2012

(54) REDUCED DEFECT SILICON OR SILICON GERMANIUM DEPOSITION IN MICRO-FEATURES

(75) Inventors: Anthony Dip, Cedar Creek, TX (US); John Gumpher, Cedar Park, TX (US); Allen John Leith, Mountain Top, PA (US); Seungho Oh, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 1493 days.

(21) Appl. No.: 11/622,204

(22) Filed: Jan. 11, 2007

(65) Prior Publication Data
US 2008/0169534 A1    Jul. 17, 2008

(51) Int. Cl.
*H01L 21/76* (2006.01)
(52) U.S. Cl. .. 438/430; 438/386; 438/479; 257/E21.572
(58) Field of Classification Search ............... 438/386, 438/430, 479; 257/E21.572
See application file for complete search history.

(56) References Cited

U.S. PATENT DOCUMENTS

| | | | | |
|---|---|---|---|---|
| 4,847,214 A * | 7/1989 | Robb et al. | | 438/430 |
| 7,439,155 B2 * | 10/2008 | Mouli et al. | | 438/429 |
| 7,732,247 B2 * | 6/2010 | Mouli et al. | | 438/78 |

OTHER PUBLICATIONS

Ming-Chang M. Lee, et al., "Silicon Profile Transformation and Sidewall Roughness Reduction Using Hydrogen Annealing," 0/7803-8732-5/2005 IEEE 2005, pp. 596-599.

* cited by examiner

*Primary Examiner* — Jarrett Stark
*Assistant Examiner* — John M Parker
(74) *Attorney, Agent, or Firm* — Oblon, Spivak, McClelland, Maier & Neustadt, L.L.P.

(57) ABSTRACT

A method is provided for reduced defect such as void free or reduced void Si or SiGe deposition in a micro-feature on a patterned substrate. The micro-feature includes a sidewall and the patterned substrate contains an isolation layer on the field area and on the sidewall and bottom of the micro-feature. The method includes forming a Si or SiGe seed layer at the bottom of the micro-feature, and at least partially filling the micro-feature from the bottom up by selectively growing Si or SiGe onto the Si or SiGe seed layer. According to one embodiment, the Si or SiGe seed layer is formed by depositing a conformal Si or SiGe layer onto the patterned substrate, removing the Si or SiGe layer from the field area, heat treating the Si or SiGe layer in the presence of $H_2$ gas to transfer at least a portion of the Si or SiGe layer from the sidewall to the bottom of the micro-feature, and etching Si or SiGe residue from the field area and the sidewall.

16 Claims, 13 Drawing Sheets

US 8,263,474 B2

REDUCED DEFECT SILICON OR SILICON GERMANIUM DEPOSITION IN MICRO-FEATURES

CROSS-REFERENCE TO RELATED APPLICATION

This application is related to co-pending U.S. patent application Ser. No. 11/035,730, entitled "MICRO-FEATURE FILL PROCESS AND APPARATUS USING HEXACHLORODISILANE OR OTHER CHLORINE-CONTAINING SILICON PRECURSOR," filed on Jan. 18, 2005, the entire content of which is herein incorporated by reference.

FIELD OF THE INVENTION

The present invention relates to semiconductor processing. One example relates to silicon or silicon germanium filling of etched micro-features formed in a patterned substrate.

BACKGROUND OF THE INVENTION

Micro-features are frequently created during the fabrication of semiconductor devices in order to isolate devices or to create other devices, for example capacitors. The micro-features may be etched in the surface of a substrate or etched in the surface of layers of materials formed on a substrate. As circuit geometries shrink to ever smaller micro-feature sizes, the aspect ratio (ratio of depth to width) of these micro-features increases. In addition to the ever smaller micro-feature sizes, increasingly complex micro-feature shapes and micro-feature sidewall profiles are used for advanced semiconductor devices.

Etched micro-features are often filled with silicon (Si) or silicon germanium (SiGe), where reduced defect filling is required. One common type defect is the creation of voids inside the micro-feature during a fill process. These voids cause areas of high electrical resistance and may interfere with circuit operation. Seams created in the fill process can also cause process and/or circuit operation problems. Conventional Si micro-feature fill processes include conformal Si deposition over the surfaces of the micro-feature where the level of defects inside the micro-feature increases as the aspect ratio and complexity increases. Filling micro-features using conformal Si deposition methods can create a center seam in perfectly vertical sidewall features, and can close up (pinch off) the opening of more complex shaped micro-features before the fill is complete inside the micro-feature, thereby creating voids. Thus, conventional conformal deposition techniques can create defects, and this problem is especially acute when voids are created in filling micro-features with retrograde walls (walls that overhang such that the opening of the micro-feature is smaller than it would be with a vertical wall).

Thus, new Si and SiGe fill processes are needed that provide reduced defects for void free filling of complex micro-feature shapes and profiles for advanced semiconductor devices.

SUMMARY OF THE INVENTION

One example of the invention provides void free or reduced defect Si and SiGe deposition in, or filling of, complex micro-feature shapes and profiles etched in patterned substrates. The micro-features contain a sidewall and a bottom. In some embodiments, the sidewall has an area of retrograde profile relative to a direction from the top of the micro-features to the bottom of the micro-features. According to an embodiment of the invention, the method includes forming a Si or SiGe seed layer at the bottom of a micro-feature, and at least partially filling the micro-feature by selectively growing Si or SiGe onto the Si or SiGe seed layer in a manner that results in uniform bottom up Si growth across a cross-section of the micro-feature.

According to one embodiment of the invention, the method includes providing a patterned substrate containing a field area and a recessed micro-feature including a sidewall and a bottom. In some embodiments, the sidewall has an area of retrograde profile. Further, the patterned substrate can have an isolation layer on the sidewall and on the bottom of the micro-feature and on the field area. The method further includes forming a Si or SiGe seed layer at the bottom of the micro-feature by depositing a conformal Si or SiGe layer onto the patterned substrate, removing the Si or SiGe layer from the field area, heat treating the Si or SiGe layer in the presence of $H_2$ gas to transfer at least a portion of the Si or SiGe layer from the sidewall to the bottom of the micro-feature, etching Si or SiGe residue from the field area and the sidewall, and at least partially filling the micro-feature from the bottom up by selectively growing Si or SiGe onto the Si or SiGe seed layer.

According to another embodiment of the invention, a semiconductor device is provided. The device includes a patterned substrate containing a void free Si or SiGe filled micro-feature, where the micro-feature has a sidewall and a bottom. In some embodiments, the sidewall has an area of retrograde profile relative to a direction from the top of the micro-feature to the bottom of the micro-feature.

BRIEF DESCRIPTION OF THE DRAWINGS

In the accompanying drawings:

FIGS. 1A-1G schematically illustrate a Si or SiGe micro-feature deposition and fill process according to an embodiment of the invention;

DETAILED DESCRIPTION OF SEVERAL EMBODIMENTS OF THE INVENTION

Figure 1A:
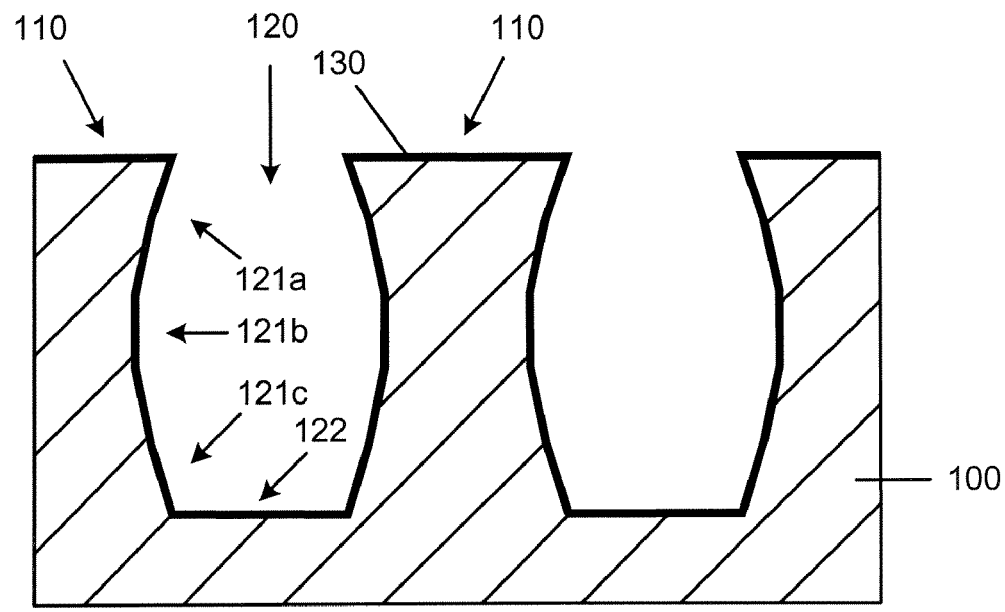
FIG. 1A schematically shows a patterned substrate containing a micro-feature including a retrograde profile sidewall according to an embodiment of the invention.
Figure 1B:
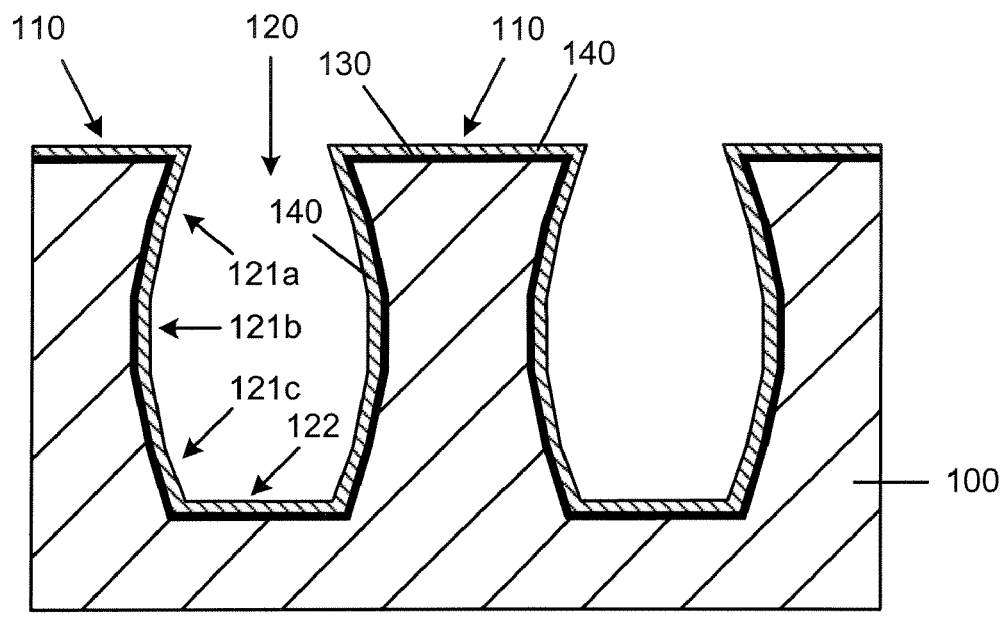

Embodiments of the invention can, for example, be used where conventional Si or SiGe fill methods fail to provide defect or void free filling of recessed micro-features including complex shapes and profiles. While embodiments of the invention can be used to fill a variety of micro-feature shapes, including pro-grade and vertical walled micro-features, aspects of the invention are especially useful for depositing or filling micro-features with retrograde walls. The reduced void or void free Si or SiGe filling process described in embodiments of the invention is typically significantly less sensitive to micro-feature shapes and profiles than conventional fill methods. For example, when filling a plurality of micro-features including different widths, conventional Si or SiGe fill methods often must overfill the narrower micro-features in order to completely fill the wider micro-features. This can create difficulties with chemical mechanical polishing (CMP) uniformity during a subsequent planarization step. According to one embodiment of the invention, the method provides reduced void or void free Si or SiGe filling of a wide variety of micro-features including different widths, but the same or similar depths, with minimum overfilling.

Further, embodiments of the present invention can be used to partially fill micro-features such that the aspect ratio is reduced. Afterward, other material may be added to the micro-feature, or another deposition process may be performed on the micro-feature to deposit the same or a different material. Thus, the micro-feature may be "capped off" with a material different than the material initially deposited. Embodiments where the micro-feature is capped off with a different material are particularly useful for reducing cross-talk, which can occur, for example, in logic circuits. For example, high aspect ratio features in logic circuits cannot be reliably filled with oxide materials. Thus, embodiments of the present invention may be used to partially fill a bottom of the feature with Si or SiGe, for example, to reduce the aspect ratio of the feature, and oxides, nitrides and/or oxynitrides can be used to cap off the feature. Some chemistries used for capping off the micro-feature include thermal decomposition of silane ($SiH_4$) and dichlorosilane ($SiCl_2H_2$). As used herein, SiGe refers to $Si_xGe_{1-x}$ materials, where x is the atomic fraction of Si and 1-x is the atomic fraction of Ge, respectively. According to embodiments of the invention, x can vary from about 1, corresponding to substantially pure Si, to about 0, corresponding to substantially pure Ge. In some embodiments, x is at least 0.8, 0.85, 0.90, or even at least 0.95.

According to embodiments of the invention, the micro-features can include a wide variety of different shapes and profiles. The term micro-feature includes a recessed feature formed in a substrate surface and/or in a layer or layers formed on a substrate surface. The micro-feature may be formed by an etch process, for example a dry etch process. The width of the micro-feature can be on the micrometer scale, and typically on the sub-micron scale, i.e., less than 1 micrometer ($\mu m=10^{-6}$ m). The depth of the micro-feature can, for example, be greater than 1 µm. In one example, the micro-feature can have a width of 0.5 µm, depth of 1 µm, and an aspect ratio of 2. The micro-feature can, for example, contain a trench, a via hole, or both. A micro-feature can have a retrograde sidewall profile relative to a direction from the top of the micro-feature to the bottom of the micro-feature. In one example, the top (opening) of a micro-feature is narrower than the widest part of the micro-feature. Other micro-feature sidewall areas in which embodiments of the invention may be applied are generally orthogonal to the substrate surface (i.e., straight-edged sidewall), or pro-grade (i.e., an angle between an orthogonal projection at the micro-feature edge and the sidewall is less than 180°). It should be noted that, micro-features with retrograde walls can be the preferred shape in certain types of devices. For example, micro-features with retrograde walls can have smaller openings than micro-features with vertical or prograde walls. Therefore, the amount of area available on the plane just above the micro-feature available for other devices is increased relative to vertical wall or prograde wall micro-features. That is, retrograde features may be preferred to provide more surface "real estate" for other features of an integrated circuit.

FIG. 1A schematically shows a patterned substrate 100 containing a micro-feature 120 including a retrograde profile area 121a according to an embodiment of the invention. The patterned substrate 100 has an un-etched field area 110 around the micro-feature 120. The micro-feature 120 can be etched in the substrate 100, for example an epitaxially grown Si or SiGe substrate 100. In addition to the retrograde profile area 121a, the exemplary micro-feature 120 has a straight-edged side wall area 121b, and a prograde sidewall area 121c above the bottom 122a of the micro-feature 120. Other micro-feature structures contemplated and considered include a retrograde sidewall area and a bottom, and a straight-edged side wall area or a prograde sidewall area. In one example, a micro-feature may consist of a retrograde sidewall area and a bottom.

Still referring to FIG. 1A, surfaces of the micro-feature 120 and the field area 110 contain a conformal isolation layer 130 grown or deposited thereon. The isolation layer 130 electrically isolates neighboring devices from one another in terms of device activity. The isolation layer 130 may include an oxide layer (e.g., $SiO_2$), a nitride layer (e.g., SiN), an oxynitride layer (e.g., SiON), or a combination thereof. The isolation layer 130 prevents selective Si or SiGe growth in the micro-feature 120 due to lack of a Si or SiGe growth surface.

Embodiments of the invention provide a method for filling or partially filling the micro-feature 120 by forming a Si or SiGe seed layer at the bottom 122 and then filling or partially filling the micro-feature 120 from the bottom up by selectively growing Si or SiGe onto the Si or SiGe seed layer at the bottom 122, without growing Si or SiGe directly onto the isolation layer 130. Si or SiGe growth onto the Si or SiGe seed layer is typically performed using process parameters that enable bottom up uniform Si or SiGe growth across the cross-section of the micro-feature 120 until the micro-feature 120 is filled with Si or SiGe. According to embodiments of the invention, the Si or SiGe seed layer may be formed through a combination of steps that include Si or SiGe layer deposition, heat treating, and etching. Embodiments of the invention can provide void free or reduced void Si or SiGe filling of or deposition in a wide variety of micro-features including different widths, but equal or similar depths, with minimum overfilling, due to the bottom up Si or SiGe growth. It should be noted that in this application, the term "step" does not prohibit two steps from being performed simultaneously or partially overlapping in time.

Figure 1C:
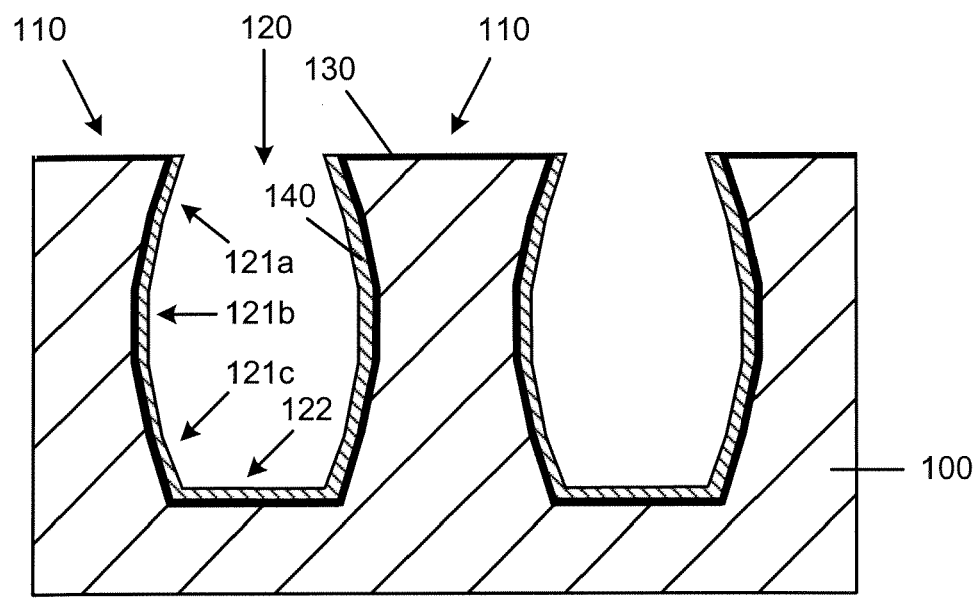
Figure 1D:
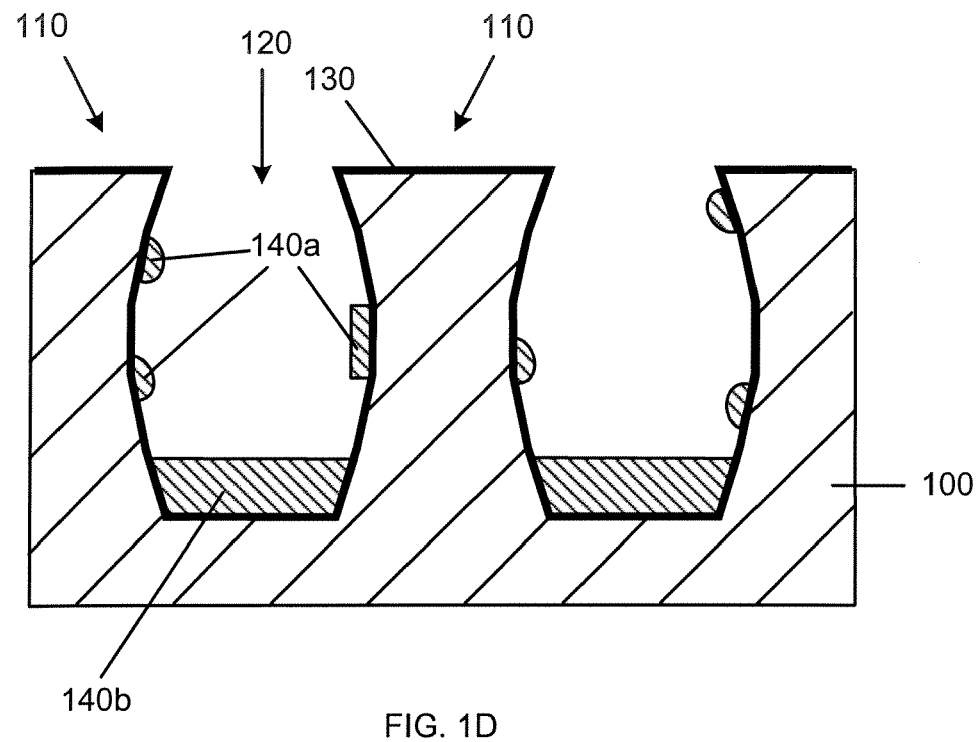
Figure 1E:
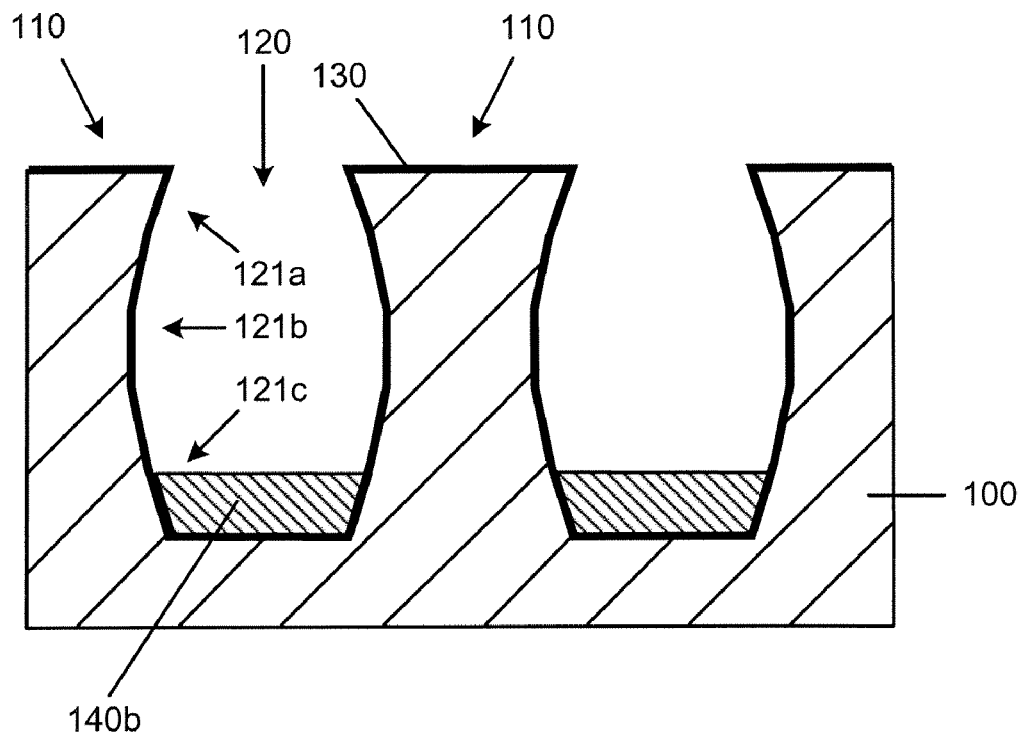
Figure 1F:
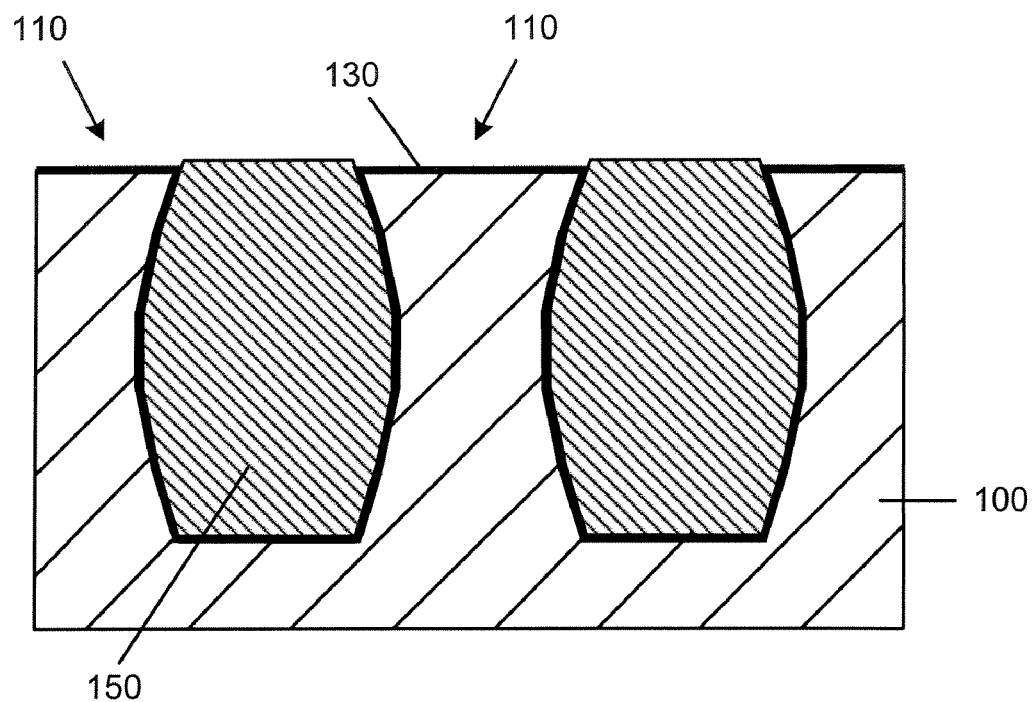
Figure 1G:
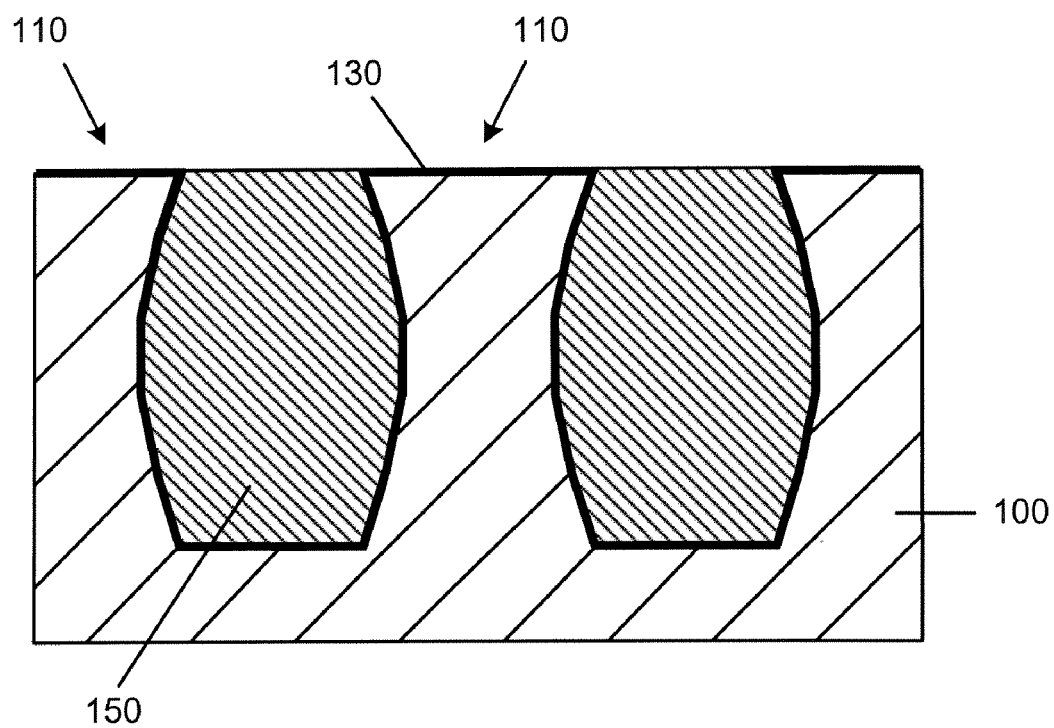
Figure 2:
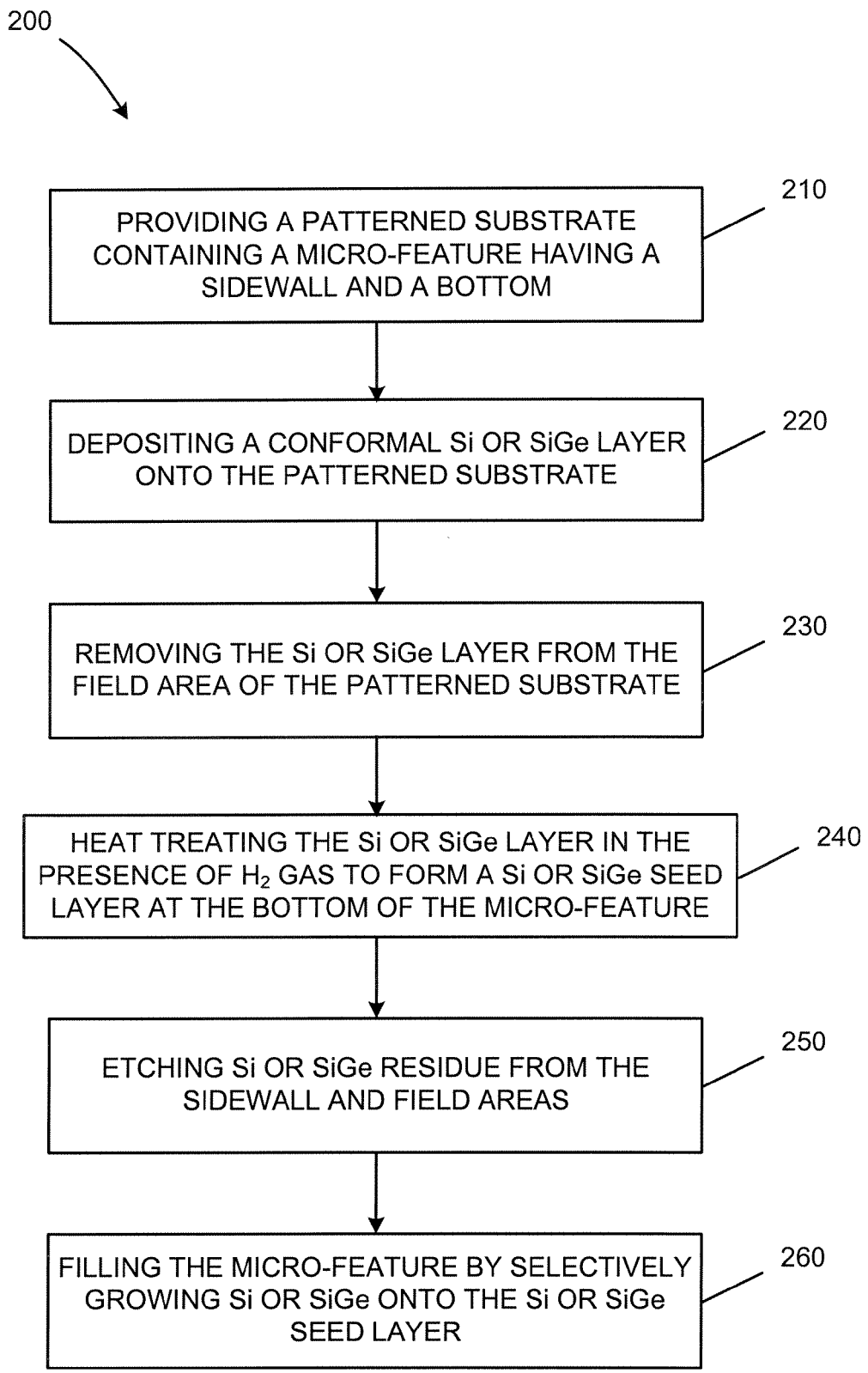
FIG. 2 is a process flow diagram for the Si or SiGe micro-feature deposition and fill process described in FIGS. 1A-1G.

FIGS. 1A-1G schematically illustrate a Si or SiGe micro-feature deposition and fill process according to an embodiment of the invention, and FIG. 2 is a process flow diagram for the Si or SiGe micro-feature deposition and fill process described in FIGS. 1A-1G.

The process 200 described in FIG. 2 includes, in step 210, providing patterned substrate 100 depicted in FIG. 1A into a process chamber of a processing system. The processing system can, for example, be the batch processing system depicted and described in FIG. 8. However, other types of processing systems can be used.

Once the substrate 100 is in the process chamber, the process chamber is evacuated and the patterned substrate 100 heated to a desired temperature for Si or SiGe deposition, for example between about 400° C. and about 900° C. It is also possible to evacuate the process chamber in advance of or during placement of the substrate 100. In step 220, a conformal Si or SiGe layer 140 (FIG. 1B) of polycrystalline silicon (poly-Si) or silicon germanium is deposited onto the isolation layer 130 on the patterned substrate 100. The conformal Si or SiGe layer 140 typically continuously covers the field area 130, and the sidewall areas 121a-121c and bottom 122 of the micro-feature 120. In one example, a conformal Si layer 140 may be deposited by chemical vapor deposition (CVD) using a process gas containing a silicon-containing gas and optionally an inert gas. In one example, a 200 nm thick conformal Si layer 140 may be deposited using a process gas containing $SiH_4$ at a substrate temperature of 620° C. and a process chamber pressure of 0.2 Torr. Other silicon-containing gases may be used for depositing the conformal Si layer 140, for example chlorosilanes, e.g., tetrachlorosilane ($SiCl_4$), trichlorosilane ($SiHCl_3$), dichlorosilane ($SiCl_2H_2$), chlorosilane ($SiH_3Cl$), and chlorodisilanes, e.g., hexachlorodisilane ($Si_2Cl_6$). Low gas pressure processing may be utilized, where process gas pressures are between about 1 mtorr and about 50 mTorr, or between about 50 mTorr and about 1 Torr. Alternately, process gas pressures may be higher than 1 Torr, for example higher than 10 Torr. Process gas pressures near atmospheric pressure may be used but often result in poor conformality over high aspect ratio micro-features. A conformal SiGe layer 140 may be deposited by CVD using a process gas containing a silicon-containing gas and a germanium containing gas. The germanium-containing gas can, for example, contain $GeH_4$ or $GeCl_4$.

In step 230, the conformal Si or SiGe layer 140 is removed from the field area 110 of the patterned substrate 100 as depicted in FIG. 1C. In one example, the conformal Si or SiGe layer 140 may be removed using chemical mechanical polishing (CMP) after transferring the patterned substrate 100 from the process chamber to a CMP system. CMP typically provides selective removal of the Si or SiGe layer 140 on the field area 110 while retaining the Si or SiGe layer 140 inside the micro-feature 120. In another example, the removal may be performed by a sputtering process. Other processes are also available for removing the layer 140 from the field area 110. The isolation layer 130 may serve as an etch-stop layer for Si or SiGe removal from the field area 110.

In step 240, the patterned substrate 100 is heat treated or annealed in the process chamber in the presence of $H_2$ gas to transfer at least a portion of the Si or SiGe layer 140 from the sidewall areas 121a-121c to the bottom 122, thereby forming a Si or SiGe seed layer 140b as depicted in FIG. 1D. The heat treating step 240 may be performed at substrate temperature greater than about 800° C., for example about 900° C., and a process chamber pressure of 0.35 Torr. The $H_2$ gas may be pure $H_2$ or may further contain an inert gas, for example Ar or $N_2$. While heat treatment alone functions to move deposited material from the sidewall areas 121a-121c of the micro-feature 110 to the bottom 122, heat treatment in the presence of $H_2$ gas facilitates migration of Si and Ge atoms and lowering of the surface energy between the isolation layer 130 and the Si or SiGe material in the micro-feature 110. The Si or SiGe material will typically "bead" up as the surface energy is decreased, but the Si or SiGe material need not melt in order to migrate to the bottom 122 of the micro-feature 110. Rather, the Si or SiGe material will collect in the narrow portions of the micro-feature, thus facilitating a reduced void or void-free deposition. In other words, some areas of the micro-feature 122 that are otherwise difficult to fill can be filled when the Si or SiGe material beads up in the narrow portions of the micro-feature 122. Gravity may also facilitate migration of the material to the bottom of the feature As depicted in FIG. 1D, Si or SiGe residue (unwanted Si or SiGe seeds) 140a may be present on the sidewall areas 121a-121c of the micro-feature 120 following the heat treating step 240 due to incomplete transfer of the Si or SiGe layer 140 to the bottom 122. In step 240, the substrate temperature, heat treating time, and $H_2$ gas composition are processing parameters that may be utilized to enhance the formation of the Si or SiGe seed layer 140b by optimizing the transfer of Si or SiGe from the sidewall areas 121a-121c to the bottom 122.

In step 250, Si or SiGe residue 140a is etched from the sidewall areas 121a-121c (and any Si or SiGe residue remaining on the field area 110 from step 240), as depicted in FIG. 1E. Removal of Si or SiGe residue 140a from the sidewall areas 121a-121c enables subsequent selective Si or SiGe growth onto the Si or SiGe seed layer 140b, thereby deposition in, or filling of, the micro-feature 120 from the bottom up. In one example, the etching may be performed by exposing the patterned substrate to a $F_2$-containing etching gas of $F_2$ and $N_2$ at a substrate temperature of 300° C. The process gas pressure in step 250 may be less than about 100 Torr, for example between about 0.2 Torr and about 10 Torr. Other etching gases that may be utilized at relatively low substrate temperatures (e.g., about 300° C.) include HF, $ClF_3$, and HCl. At relatively high substrate temperatures (e.g., greater than about 900° C.), $SiCl_2H_2$ or other chlorosilane and dichlorosilane gases, as well as $H_2$ gas, may be utilized to remove unwanted Si or SiGe such as the Si or SiGe residue 140a.

According to one embodiment of the invention, the etching step 250 may be omitted from the process 200 if the heat treating step 240 transfers most or all of the Si or SiGe layer 140 to the bottom 122 leaving little or no Si or SiGe residue 140a on the sidewall areas 121a-121c.

In step 260, the micro-feature 120 is substantially filled with Si or SiGe 150 by selectively growing Si or SiGe (poly-Si or SiGe) onto the Si or SiGe seed layer 140. FIG. 1F schematically shows the resulting structure, where optional slight Si or SiGe overfilling of the micro-feature 120 is depicted. The excess Si or SiGe in the Si or SiGe overfill may be removed by CMP to planarize the bulk Si or SiGe 150 to be aligned with the isolation layer 130 on the field 110. Alternatively, the planarization may be performed by sputtering, using the isolation layer 130 as an etch-stop layer. In one example, the selective Si growth may be performed using a substrate temperature of 800° C. and a process gas containing $Si_2Cl_6$ and $N_2$. The process gas pressure in step 260 may be less than about 100 Torr, for example between about 0.2 Torr and about 10 Torr. Other process gases that may be utilized for Si deposition include chlorosilane gases, as well as $H_2$ gas.

In order to reduce the total processing time for the process flow 200, a thick conformal Si or SiGe layer 140 may be deposited in step 220, thereby producing a thick Si or SiGe seed layer 140b at the bottom 122 of the micro-feature 120 in the heat treating step 240, which can reduce the deposition time required for the Si or SiGe micro-feature fill in step 260.

Figure 3A:
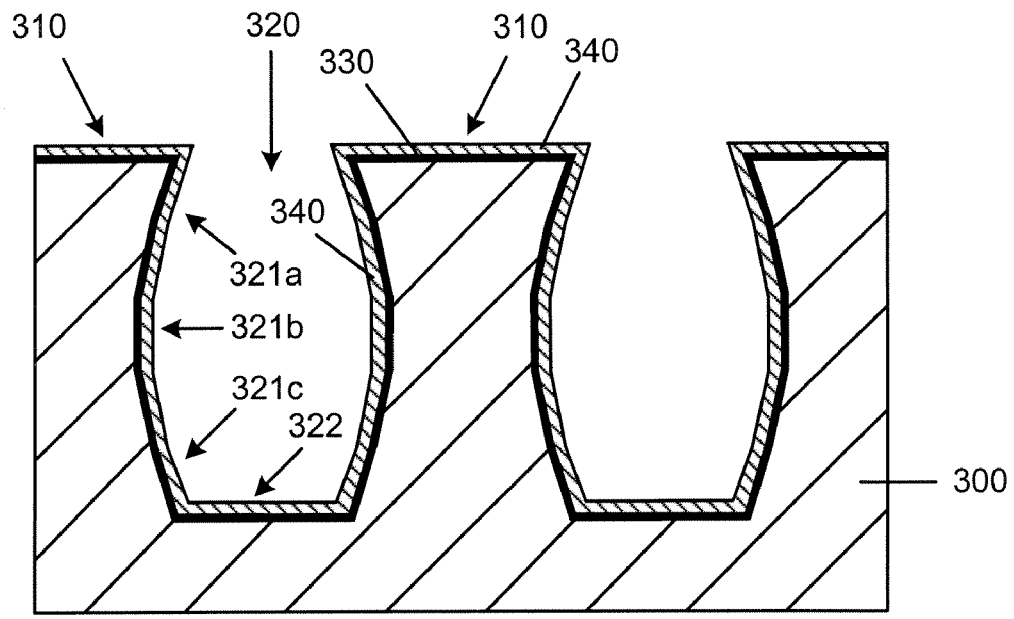
FIGS. 3A-3D schematically illustrate a Si or SiGe micro-feature deposition and fill process according to another embodiment of the invention.
Figure 3B:
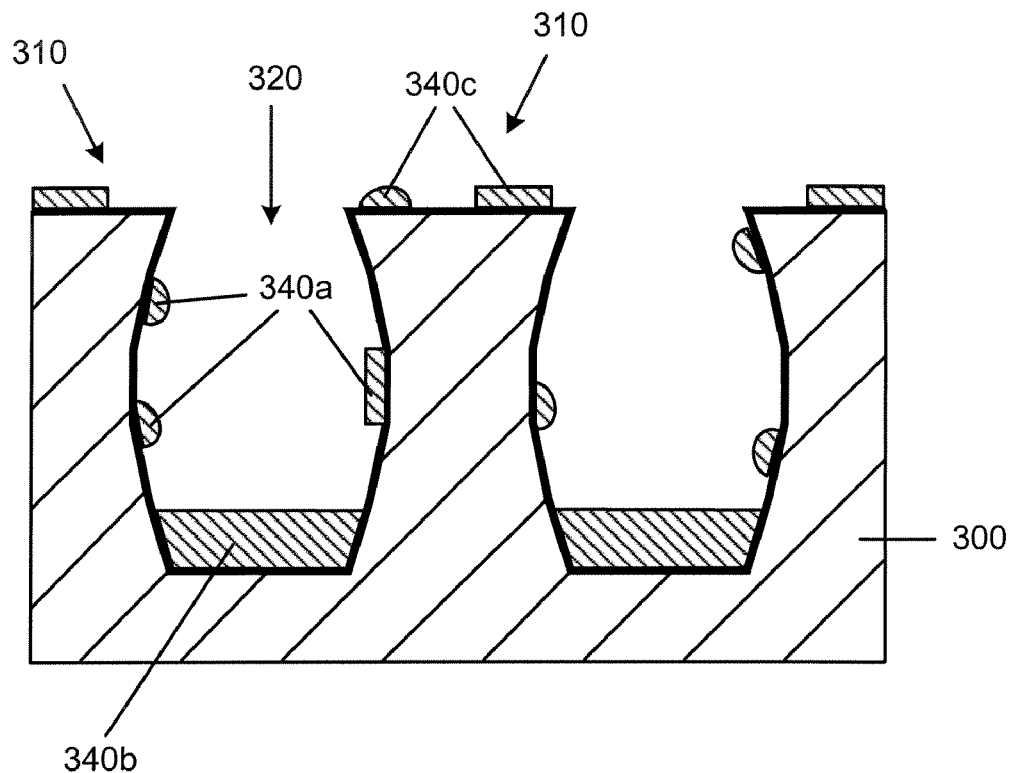
Figure 3C:
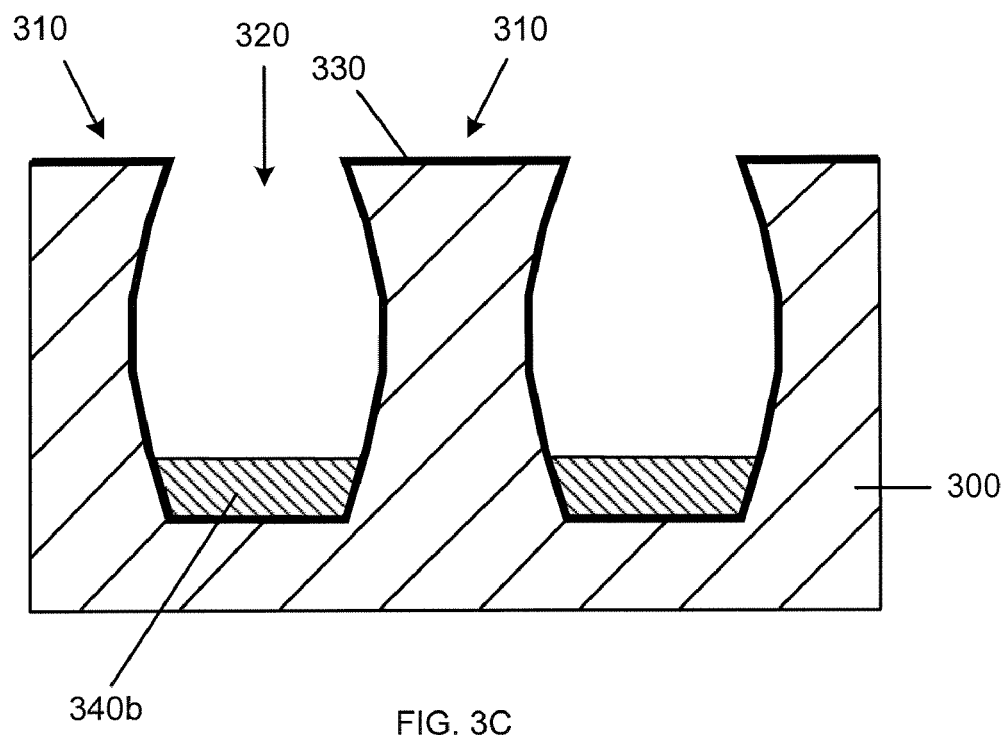
Figure 3D:
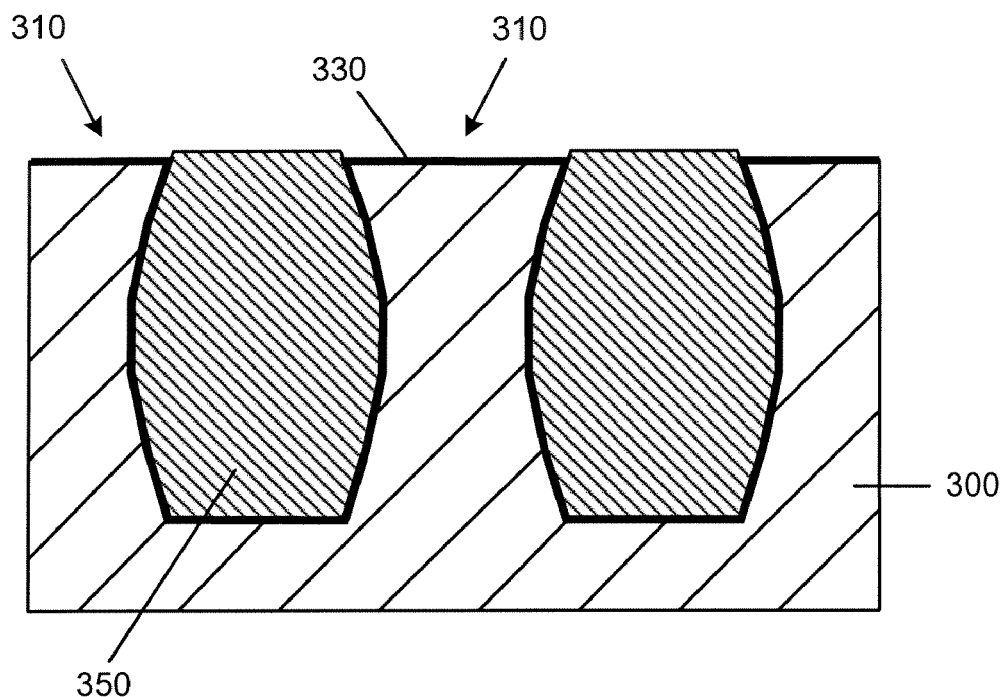
Figure 4:
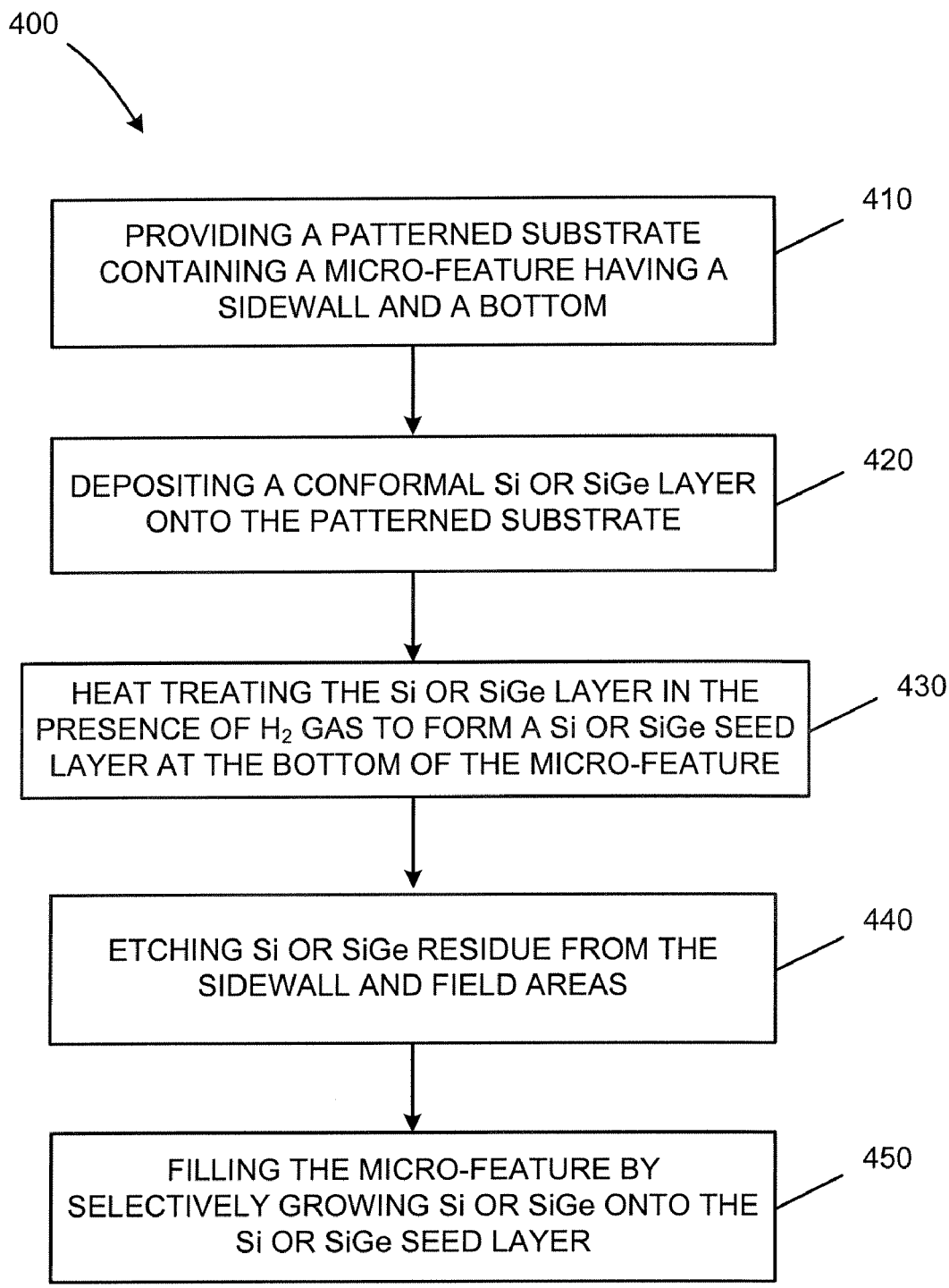
FIG. 4 is a process flow diagram for the Si or SiGe micro-feature deposition and fill process described in FIGS. 3A-3D.
Figure 5:
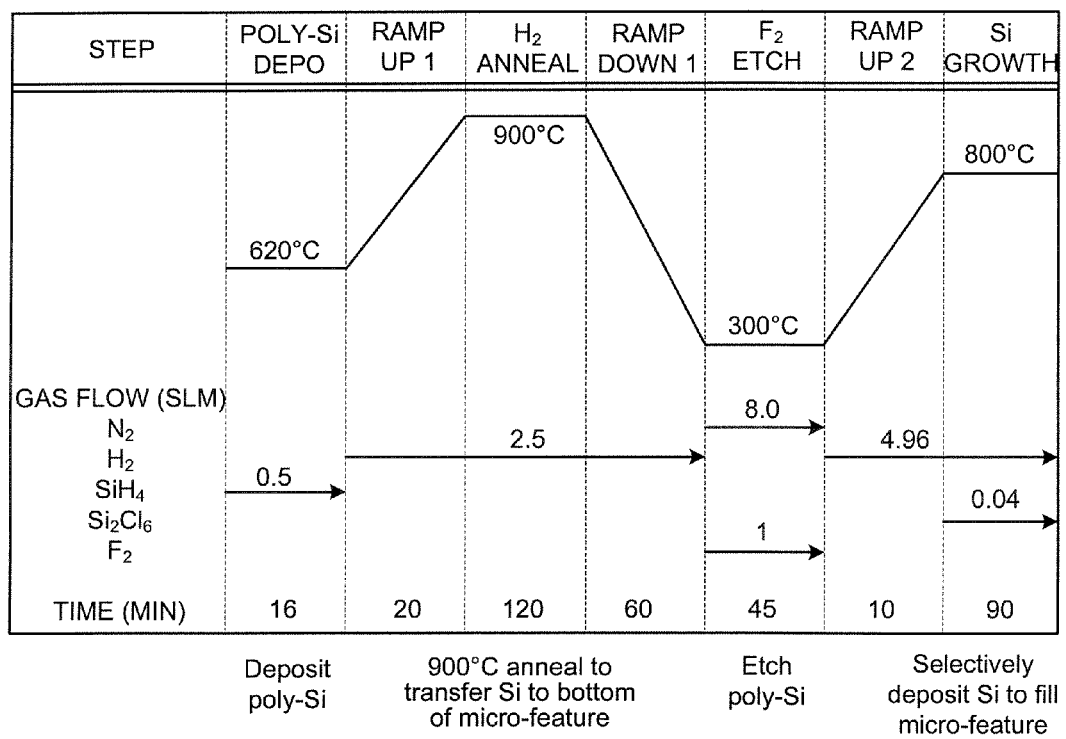
FIG. 5 illustrates substrate temperature and gas flows as a function of processing time for a Si or SiGe micro-feature deposition and fill process according to the embodiment depicted in FIGS. 3A-3D and FIG. 4.

FIGS. 3A-3D schematically illustrate a Si or SiGe micro-feature deposition and fill process according to another embodiment of the invention, and FIG. 4 is a process flow diagram for the Si or SiGe micro-feature deposition and fill process described in FIGS. 3A-3D. FIG. 5 illustrates exemplary substrate temperature and gas flows as a function of processing time for the Si or SiGe micro-feature deposition and fill process 400 of FIG. 4. Unlike the process 200 described in FIG. 2, the process 400 described in FIG. 4 integrates many "unit" processes, including conformal Si or SiGe deposition, heat treating, etching, and selective Si or SiGe growth, without air exposure between the steps, thereby eliminating potential contamination and oxidation encountered during air exposure in the removal step of the of the process 200.

The process 400 described in FIG. 4 is similar to the process 200 described in FIG. 2, but in the process 400, the removal step 230 described in the process 200 is omitted from the process flow. The process 400 includes, in step 410, providing a patterned substrate 300 into a process chamber, and in step 420, depositing a conformal Si or SiGe layer 340 onto isolation layer 330 on the patterned substrate 300 (FIG. 3A). In one example, a 200 nm thick conformal Si layer 340 may be deposited by CVD at a substrate temperature of 620° C. and a process chamber pressure of 0.2 Torr using a $SiH_4$ gas flow of 0.5 slm and an exposure time of 16 min. The conformal Si layer 340 typically continuously covers the field area 310, and the sidewall areas 321a-321c and bottom 322 of the micro-feature 320.

In the illustrated example, following the conformal Si or SiGe deposition in step 420, the substrate temperature is ramped up to a heat treating temperature. For example, the substrate can be heated from 620° C. up to 900° C. over a time period of 20 minutes as depicted in FIG. 5, heat treated at 900° C. for 120 min in step 430, and then the substrate temperature is typically ramped down to 300° C., for example. As depicted in FIG. 5, the patterned substrate is typically exposed to a $H_2$ gas flow of 2.5 slm during the ramp up, heat treating, and ramp down steps. During the heat treating step 430, at least a portion of the Si or SiGe layer 340 is transferred from the sidewall areas 321a-321c and from the field area 310 to the bottom 322 of the micro-feature 320, thereby forming a Si or SiGe seed layer 340b. As depicted in FIG. 3B, Si or SiGe residue 340a may be present on the field 310 and Si or SiGe residue 340c may be present on the sidewalls of the micro-feature 320 following the heat treating process step 340 due to incomplete transfer of the Si or SiGe layer 340 to the bottom 322.

In step 440, Si or SiGe residue 340a is etched from the sidewall areas 321a-321c and Si or SiGe residue 340c is etched from the field area 330. Removal of Si or SiGe residues 340a and 340c helps to limit subsequent Si or SiGe growth to bottom up Si or SiGe growth onto the Si or SiGe seed layer 340b inside the micro-feature 320. As shown in FIG. 5, the etching may be performed by exposing the patterned substrate 300 to a $F_2$-containing etching gas of 1 slm $F_2$ and 8 slm $N_2$ for 45 min at a substrate temperature of 300° C. The process gas pressure in step 440 may be less than about 100 Torr, for example between about 0.2 Torr and about 10 Torr.

According to one embodiment of the invention, the etching step 440 may be omitted from the process 400 if the heat treating step 430 sufficiently transfers the Si or SiGe layer 340 to the bottom 322 without leaving an excessive Si or SiGe residue 340a on the sidewall areas 121a-121c or Si or SiGe residue 340c on the field area 310.

Following the etching step 440, the substrate temperature is typically ramped up to a higher temperature for a period of time while exposed to a gas. For example, the substrate can be heated to 800° C. over a time period of 10 min while flowing 4.96 slm $H_2$ in the process chamber. In step 450, the micro-feature 320 is filled with bulk Si or SiGe 350 by selectively growing poly-Si or SiGe onto the Si or SiGe seed layer 340b. As depicted in FIG. 5, Si growth may be performed using a process gas containing 0.04 slm $Si_2Cl_6$ and 4.96 slm $N_2$. An exposure time of 90 min deposits about 200 nm of poly-Si onto the Si seed layer 340b. However, as those skilled in the art will readily recognize, the exposure time may be adjusted as needed to fill the micro-feature 320. FIG. 3D schematically shows the resulting structure, where optional slight Si or SiGe overfilling of the micro-feature 320 is depicted. The excess Si or SiGe may be removed by CMP to planarize the Si or SiGe 350 to be aligned with the isolation layer 330 on the field 310.

Alternatively, the planarization may be performed by sputtering, using the isolation layer 330 as an etch-stop layer. Further, other methods of planarization may be used.

Figure 6A:
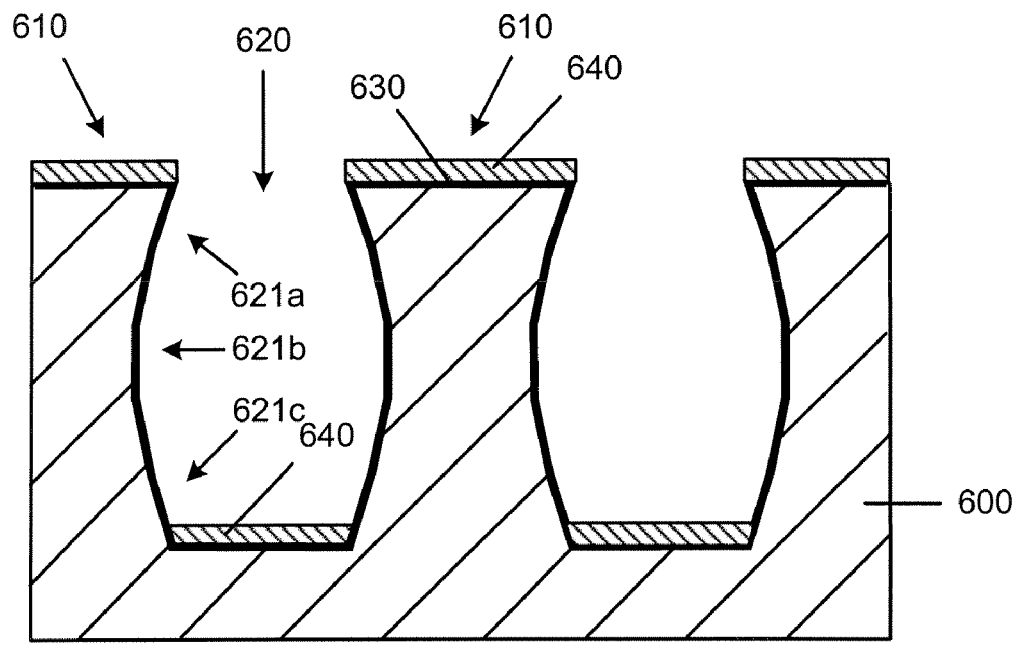
FIGS. 6A-6C schematically illustrate a Si or SiGe micro-feature deposition and fill process according to an yet another embodiment of the invention.
Figure 6B:
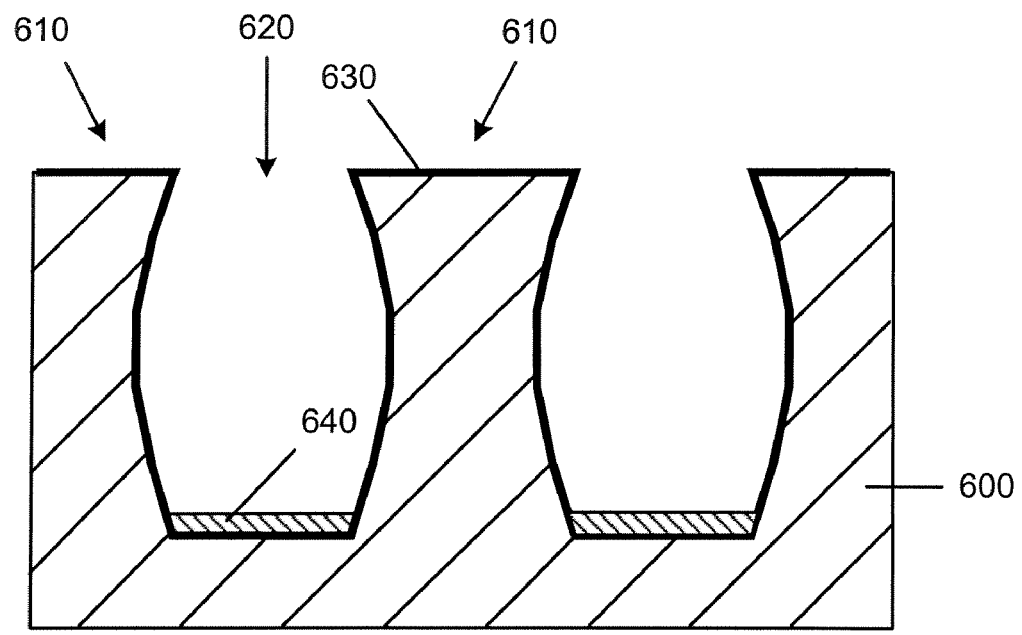
Figure 6C:
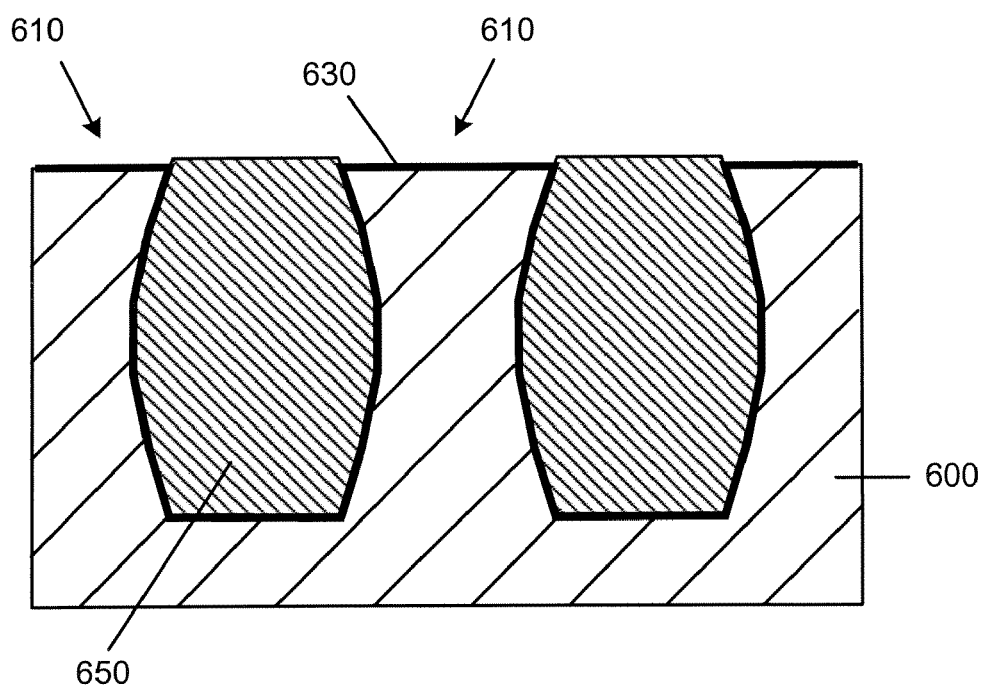
Figure 7:
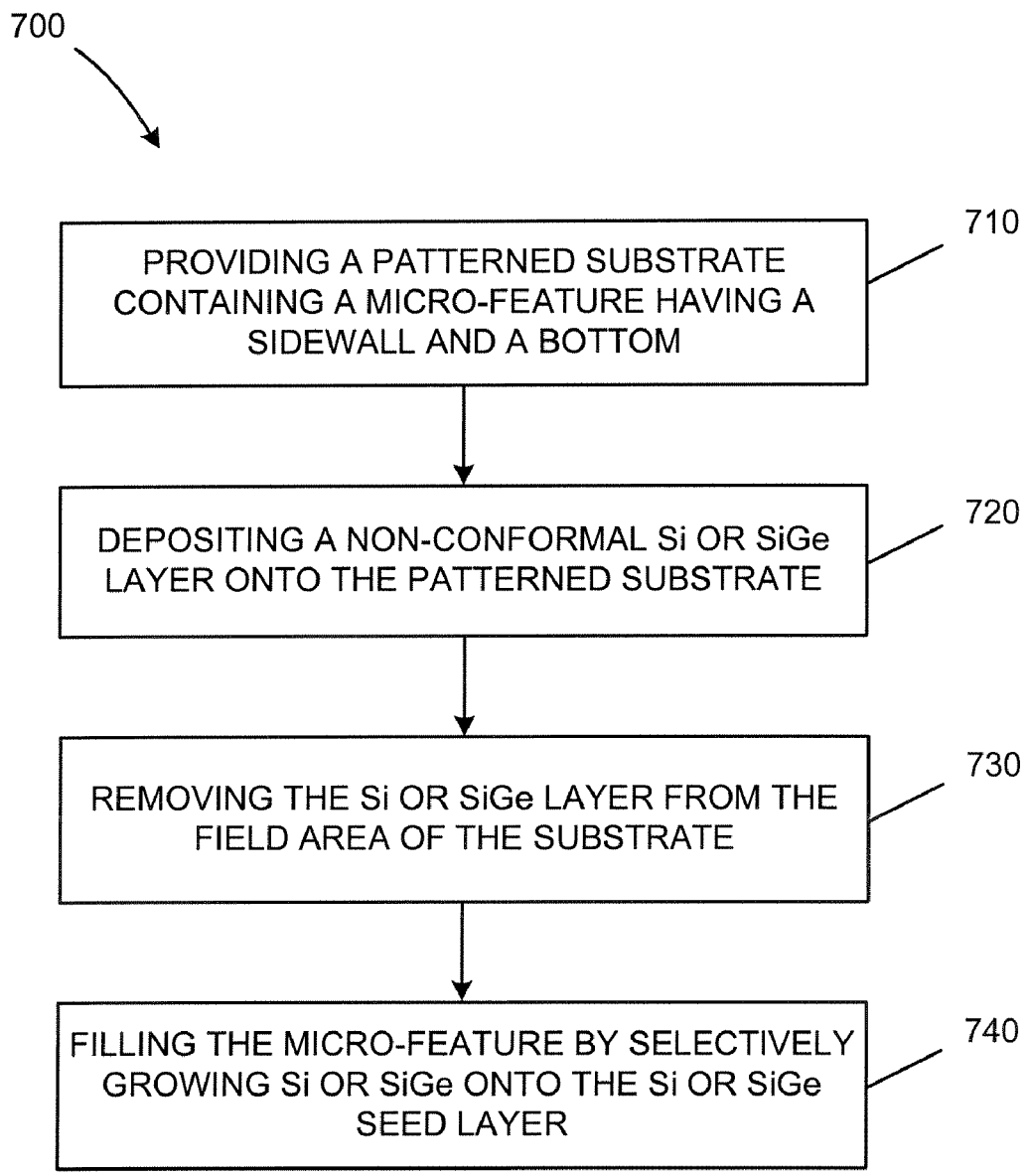
FIG. 7 is a process flow diagram for the Si or SiGe micro-feature deposition and fill process described in FIGS. 6A-6C.

FIGS. 6A-6D schematically illustrate a Si or SiGe micro-feature deposition and fill process according to an yet another embodiment of the invention, and FIG. 7 is a process flow diagram for the Si or SiGe micro-feature deposition and fill process described in FIGS. 6A-6C.

The process 700 described in FIG. 7 is similar to the process 200 described in FIG. 2, but unlike in the process 200, a non-conformal Si or SiGe layer 640 is deposited onto a patterned substrate 600 in the process 700.

The process 700 includes, in step 710, providing a patterned substrate 700 into a process chamber, and in step 720, depositing a non-conformal Si or SiGe layer 640 onto isolation layer 630 on the patterned substrate 600 (FIG. 6A). In one example, the non-conformal Si or SiGe layer 640 may be deposited by sputter deposition. The non-conformal Si or SiGe layer 640 typically covers the field area 310 and the bottom 322 of the micro-feature 620, with little or no Si or SiGe deposition on the sidewall areas 621a-621c.

In step 730, the non-conformal Si or SiGe layer 640 is removed from the field area 610 of the patterned substrate 600 (FIG. 6B), for example by CMP.

In step 740, the micro-feature 620 is filled with Si or SiGe 650 by selectively growing poly-Si or SiGe onto the Si or SiGe seed layer 640. FIG. 6C schematically shows the resulting structure, where slight overfilling of the micro-feature 620 is depicted. The excess Si or SiGe, if present, may be removed by CMP to planarize the Si or SiGe 650 to be aligned with the isolation layer 630 on the field area 610. Alternatively, the planarization may be performed by sputtering, using the isolation layer 630 as an etch-stop layer. Other types of planarization can also be used.

According to another embodiment of the invention, the process 700 may further include heat treating the non-conformal Si or SiGe layer 640, for example in the presence of $H_2$ gas. According to yet another embodiment of the invention, the process 700 may further include an etching process, for example using a $F_2$-containing etching gas, to remove some or all Si or SiGe residue from the field area 610 and the sidewall areas 621a-621c. According to still another embodiment of the invention, the process 700 may further include both heat treating the patterned substrate 600 in the presence of $H_2$ gas to form the Si or SiGe seed layer 640b and etching to remove any Si or SiGe residue from the field area 610 and the sidewall areas 621a-621c.

The process flows depicted in the process flow diagrams in FIGS. 2, 4, and 7, can further include pretreating the patterned substrate prior to depositing the conformal or non-conformal silicon film. The pretreating process can, for example, substantially remove an oxide layer (e.g., a native oxide or a thermal oxide) from a substrate material and other interfacial contamination that can inhibit formation of a proper silicon film. In one example, a pretreating can include exposing the patterned substrate to an $H_2$ gas at a substrate temperature of 900° C.

Processing conditions used for the process flow diagrams in FIGS. 2, 4, and 7 can include a reduced process chamber pressure, for example, less than about 1 Torr. Exemplary process gas pressure can be between about 0.1 Torr and about 0.5 Torr, for example about 0.2 Torr or 0.35 Torr. The process conditions can further include a substrate temperature between about 300° C. and about 900° C.

An exemplary embodiment of the invention details the use of $Si_2Cl_6$, or another chlorine-containing silicon precursor, as the main deposition gas for the selective Si deposition onto a Si seed layer at the bottom of a micro-feature. The chlorine-containing silicon precursor can include one or more of chlorosilanes, for example tetrachlorosilane ($SiCl_4$), trichlorosilane ($SiHCl_3$), dichlorosilane ($SiCl_2H_2$), chlorosilane ($SiH_3Cl$), and chlorodisilanes, for example the above mentioned hexachlorodisilane ($Si_2Cl_6$). The deposition characteristics of $Si_2Cl_6$ are good for use as the main deposition gas. The deposition rate when using $Si_2Cl_6$ is much lower at most operating temperatures than $SiH_4$. Si deposition using $Si_2Cl_6$ is also a reaction limited deposition rather than a transport limited deposition. This reduces the problem of premature closing of the opening of the micro-feature because reactants are better able to reach the bottom of the micro-feature.

A potential cause of voids that is unrelated to gas transport is the presence of gas phase radicals of $SiH_4$. There may be a tendency to getter these radicals at the wafer's edge, then secondly on the substrates surface and near and around the upper corners of the micro-features to be filled. As the gas phase population of these radicals is depleted in the micro-features, fewer of radicals will be available for deposition inside the micro-feature.

Additionally, unlike $SiH_4$, $Si_2Cl_6$ contains no hydrogen. Therefore, the deposited Si film does not experience hydrogen outgassing as does a Si film deposited with $SiH_4$ alone. Furthermore, if the Si film is deposited with a hydrogen-containing gas, chlorine available from the $Si_2Cl_6$, or another chlorine-containing gas will help reduce the level of hydrogen in the Si film thus reducing hydrogen outgassing. These characteristics make deposition with $Si_2Cl_6$ or other chlorine-containing gases better suited to current and future structures than are conventional process gases, and voids are less likely to form in micro-features.

$Si_2Cl_6$ acts as a curative to the problem of the presence of gas phase radicals from $SiH_4$ in two ways. First, $Si_2Cl_6$ provides a second source of more homogenous gas phase species resulting in a more conformal deposition. It is also an important source of chlorine, which helps to slow the rate of nuclei formation due to the gas phase radicals from $SiH_4$ or any other hydrogen-containing gas used in combination with the $Si_2Cl_6$. Furthermore, $Si_2Cl_6$ has better deposition characteristics for very small geometries. $Si_2Cl_6$ deposition reduces or prevents early seed formation on the top of the micro-feature and on an isolation layer covering the surfaces of the micro-feature.

The deposition characteristics of $Si_2Cl_6$ process gas can also be altered using additional gases. $H_2$, $GeH_4$, $B_2H_6$, $PH_3$, and $SiH_4$ as well as other gases can be introduced with $Si_2Cl_6$ to affect either the deposition characteristics and/or the deposited films characteristics. $B_2H_6$, and $PH_3$ will affect the conductivity, for example, and $H_2$ and $SiH_4$ can be added to increase the deposition rate. Typically, films created during micro-feature fill processes are very thick, therefore, deposition by a process with a low deposition rate may not be practical for creation of the full film thickness. The addition of $H_2$ and/or $SiH_4$ will increase the deposition rate to a more practical and manufacturable level.

Depending on the geometries to be filled, it is possible to start out with a $Si_2Cl_6$ or other chlorine-containing silicon precursor, and then to switch to another process gas for the remainder of the deposition process. Switching the process gas this way can be used to reduce the processing time or to influence the smoothness of the later deposited Si material.

In one embodiment, the process gas can be $Si_2Cl_6$ or a mixture of $Si_2Cl_6$ at the start of the fill process and then the percentage of $Si_2Cl_6$ may vary over the duration of the fill process. For example, in order to fill a micro-feature, $Si_2Cl_6$ or a combination of $Si_2Cl_6$ and another gas can be used in the beginning of the process. Then, shortly before the micro-feature is substantially filled, the process gas may be changed to a gas or gas combination with a higher deposition rate. Another change in process gas can be made when the micro-feature is substantially filled, or shortly after the micro-feature is filled. Alternatively, the gas combination can be continuously varied during the process. In one embodiment, the percentage process gas which is $Si_2Cl_6$ can be reduced in small increments or along a gradual curve while the percentage of another gas with a higher deposition rate increases gradually.

If the process gas is to be switched from $Si_2Cl_6$ or another similar gas at or around the time the micro-feature is filled, such a switching point may be identified via mathematical calculation or via trial and error, for example.

Some benefits of using $Si_2Cl_6$ as a process gas may be achieved by using alternative chlorine-containing silicon precursors, but process temperatures may increase. Examples of these are $SiH_4$+HCl, dichlorosilane, tetrachlorosilane, and trichlorosilane etc. These chlorine-containing gases can also be used in combination with the additional gases listed above to achieve the same deposition and/or deposited film characteristics. A process gas containing substantially only $Si_2Cl_6$ as an active gas, for example, would be characterized as a process gas with only one molecular formula. A process gas containing both $SiH_4$ and HCl as active gases would be characterized as including more than one molecular formula.

In addition, a chlorine-containing gas can be added at various points in the process to affect deposition characteristics, even if the gas itself may not contain silicon.

The ratio of $Si_2Cl_6$ or other chlorine-containing precursor to $SiH_4$ can, for example, be in the range of: pure $Si_2Cl_6$ with substantially no $SiH_4$ up to a combination of about 1 unit $Si_2Cl_6$: 4 units $SiH_4$. An exemplary range is from 2 units $Si_2Cl_6$: 1 unit $SiH_4$ to (1 unit $Si_2Cl_6$: 2 units $SiH_4$. An exemplary ratio of $Si_2Cl_6$ or other chlorine-containing precursor to $SiH_4$ is about 50% $Si_2Cl_6$ by volume and 50% $SiH_4$ by volume. An inert gas may or may not be included.

Figure 8:
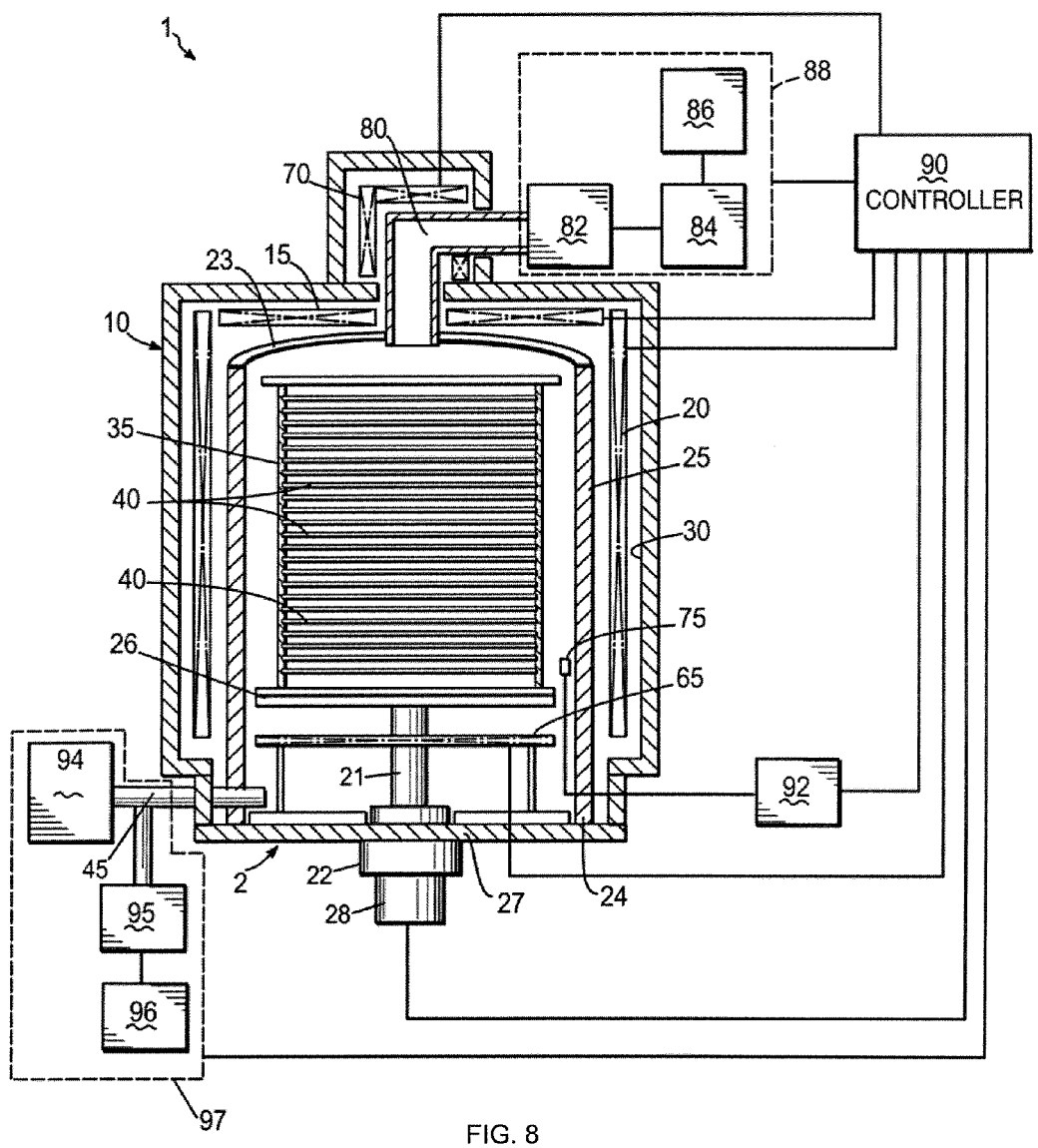
FIG. 8 shows a batch processing system which may be used to implement embodiments of the invention.

FIG. 8 shows a typical batch processing system which may be used to implement embodiments of the invention. Although the FIG. 8 shows a batch processing system, embodiments of the invention are not limited to such processing systems and can also be practiced in single wafer processing systems as will be appreciated by one skilled in the art.

In FIG. 8, the batch processing system 1 can, for example, process substrates of any size, such as 200 mm substrates, 300 mm substrates, or even larger substrates. Furthermore, the exemplary batch processing system 1 can simultaneously process up to about 200 substrates, or more. Alternately, the processing system 1 can simultaneously process up to about 25 substrates. In the illustrated example, the batch processing system 1 contains a process chamber 10 and a process tube 25 that has an upper end 23 connected to an exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the process tube 25.

When the lid 27 is positioned at its uppermost position, the lid 27 is adapted to close the open end of the manifold 2.

A gas delivery system 97 is configured for introducing gases into the process chamber 10. A plurality of gas supply lines can be arranged around the manifold 2 to supply a plurality of gases into the process tube 25 through the gas supply lines. In FIG. 1, only one gas supply line 45 among the plurality of gas supply lines is shown. The gas supply line 45 shown, is connected to a first gas source 94. In general, the first gas source 94 can supply gases for processing the substrates 40, including gases for depositing Si films (e.g., $SiH_4$, $Si_2Cl_6$) and SiGe films (e.g., $SiH_4$ or $Si_2Cl_6$ in combination with $GeH_4$ or $GeCl_4$) onto the substrates 40, and other gases such as $H_2$, $N_2$, and $F_2$.

In addition, or in the alternate, one or more of the gases can be supplied from the (remote) plasma source 95 that is operatively coupled to a second gas source 96 and to the process chamber 10 by the gas supply line 45. The plasma-excited gas is introduced into the process tube 25 by the gas supply line 45. The plasma source 95 can, for example, be a microwave plasma source, a radio frequency (RF) plasma source, or a plasma source powered by light radiation. In the case of a microwave plasma source, the microwave power can be between about 500 Watts (W) and about 5,000 W. The microwave frequency can, for example, be 2.45 GHz or 8.3 GHz. In one example, the remote plasma source can be a Downstream Plasma Source Type AX7610, manufactured by MKS Instruments, Wilmington, Mass., USA.

In the illustrated example, a cylindrical heat reflector 30 is disposed so as to cover the reaction tube 25. The heat reflector 30 typically has a mirror-finished inner surface to suppress dissipation of radiation heat radiated by main heater 20, bottom heater 65, top heater 15, and exhaust pipe heater 70. A helical cooling water passage (not shown) can be formed in the wall of the process chamber 10 as a cooling medium passage. The heaters 20, 65, and 15 can, for example, maintain the temperature of the substrates 40 between about 20° C. and about 900° C., or higher.

In the example discussed above, the vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas supply line 45 of the gas delivery system 97 and the process pressure can be adjusted by the APC 82. The trap 84 can collect unreacted precursor material and by-products from the process chamber 10.

In the illustrated example, the process monitoring system 92 comprises a sensor 75 configured for real-time process monitoring and can, for example, include a mass spectrometer (MS), a FTIR spectrometer, or a particle counter. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas delivery system 97, motor 28, process monitoring system 92, heaters 20, 15, 65, and 70, and vacuum pumping system 88. The controller 90 may be implemented as a DELL PRECISION WORKSTATION 610™. The controller 90 may also be implemented as a general purpose computer, processor, digital signal processor, etc., which causes a substrate processing apparatus to perform a portion or all of the processing steps of the invention in response to the controller 90 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 90 may be locally located relative to the processing system 1, or it may be remotely located relative to the processing system 1 via an internet or intranet. Thus, the controller 90 can exchange data with the processing system 1 using at least one of a direct connection, an intranet, and the internet. The controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, and the internet.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

Conventional methods of micro-feature filling, especially with respect to retrograde profile micro-features are unable to achieve void free filling. As should be apparent from the discussion above, embodiments of the present invention can provide reduced defect deposition such as void free filling or partial filling of micro-features, which conventional methods of micro-feature deposition are unable to accomplish.

What is claimed is:

1. A method of processing a substrate, the method comprising:
   providing a patterned substrate including a field area and a recessed micro-feature with a sidewall and a bottom;
   providing an isolation layer on the sidewall and on the bottom of the micro-feature and on the field area, the sidewall including an area of retrograde profile relative to a direction extending from a top of the micro-feature to the bottom of the micro-feature;
   forming a Si or SiGe seed layer at the bottom of the micro-feature; and
   at least partially filling the micro-feature from the bottom up by selectively growing Si or SiGe onto the Si or SiGe seed layer.

2. The method of claim 1, wherein the at least partially filling completely fills the micro-feature.

3. The method of claim 1, wherein the forming comprises:
   depositing a conformal Si or SiGe layer onto the patterned substrate; and
   heat treating the Si or SiGe layer in the presence of $H_2$ gas so as to transfer at least a portion of the Si or SiGe layer from the sidewall to the bottom of the micro-feature.

4. The method of claim 3, further comprising removing the Si or SiGe layer from the field area prior to the heat treating.

5. The method of claim 3, further comprising etching Si or SiGe residue from the field area and the sidewall prior to the at least partial filling.

6. The method of claim 5, wherein the etching comprises exposing the Si or SiGe residue to an etching gas comprising $F_2$, HF, $ClF_3$, or HCl.

7. The method of claim 1, wherein the forming comprises:
depositing a conformal Si or SiGe layer onto the patterned substrate;
removing the Si or SiGe layer from the field area;
heat treating the Si or SiGe layer in the presence of $H_2$ gas to transfer at least a portion of the Si or SiGe layer from the sidewall to the bottom of the micro-feature; and
etching Si or SiGe residue from the field area and the sidewall.

8. The method of claim 7, wherein the etching comprises exposing the heat treated Si or SiGe layer to an etching gas including at least one of $F_2$, HF, $ClF_3$, and HCl.

9. The method of claim 1, wherein the forming comprises:
depositing a non-conformal Si or SiGe layer onto the patterned substrate, wherein the Si or SiGe layer is deposited onto the field area and on the bottom of the micro-feature; and
removing the Si or SiGe layer from the field area.

10. The method of claim 9, further comprising heat treating the Si or SiGe layer in the presence of $H_2$ gas following the removing.

11. The method of claim 1, wherein the forming comprises:
depositing a non-conformal Si or SiGe layer onto the patterned substrate, wherein the Si or SiGe layer is deposited onto the field area and on the bottom of the micro-feature;
heat treating the Si or SiGe layer in the presence of $H_2$ gas; and
removing the Si or SiGe layer from the field area.

12. The method of claim 1, wherein providing the isolation layer comprises providing an oxide layer, a nitride layer, or an oxynitride layer, or a combination thereof.

13. The method of claim 1, wherein the at least partial filling comprises exposing the patterned substrate to a process gas comprising $Si_2Cl_6$.

14. A method of processing a substrate, the method comprising:
providing a patterned substrate containing a field area and a recessed micro-feature including a sidewall and a bottom;
providing an isolation layer on the sidewall and on the bottom of the micro-feature and on the field area;
forming a Si or SiGe seed layer at the bottom of the micro-feature by depositing a conformal Si or SiGe layer onto the patterned substrate;
removing the Si or SiGe layer from the field area;
heat treating the Si or SiGe layer in the presence of $H_2$ gas to transfer at least a portion of the Si or SiGe layer from the sidewall to the bottom of the micro-feature;
etching Si or SiGe residue from the field area and the sidewall; and
at least partially filling the micro-feature from the bottom up by selectively growing Si or SiGe onto the Si or SiGe seed layer.

15. The method of claim 14, wherein the providing a patterned substrate includes providing a patterned substrate including a sidewall including an area of retrograde profile relative to a direction extending from the top of the micro-feature to the bottom of the micro-feature.

16. The method of claim 14, wherein the at least partially filling includes completely filling the micro-feature.

* * * * *